United States Patent [19]

McDonnal

[11] Patent Number: 5,075,821
[45] Date of Patent: Dec. 24, 1991

[54] DC TO DC CONVERTER APPARATUS
[75] Inventor: John E. McDonnal, San Jose, Calif.
[73] Assignee: RO Associates, Sunnyvale, Calif.
[21] Appl. No.: 609,751
[22] Filed: Nov. 5, 1990
[51] Int. Cl.$^5$ .............................................. H05K 7/20
[52] U.S. Cl. .................................. 361/386; 361/388; 361/392; 361/412; 361/414; 174/52.2; 165/185
[58] Field of Search ............... 361/386, 387, 388, 392, 361/395, 396, 412, 413, 414; 174/52.2, 252; 165/80.3, 185; 357/81

[56] References Cited
U.S. PATENT DOCUMENTS
3,383,565 5/1968 Gritton .
3,909,504 9/1975 Browne ............................ 174/52.2

Primary Examiner—Gerald P. Tolin
Assistant Examiner—Young S. Whang
Attorney, Agent, or Firm—Rosenblum, Parish & Bacigalupi

[57] ABSTRACT

An improved DC to DC converter apparatus including a metal-backed PC board which serves as the base plate of the device and has the principal power consuming components affixed thereto, and a conventional circuit board having the relatively lower power consuming electronic components affixed to it, the latter board being secured in closely spaced relationship to the metal-backed board using connecting elements which provide both electrical and thermal interconnection between the two boards. All device connect pins extend from the conventional board, and the entire device is potted in a thermally conductive potting material.

20 Claims, 4 Drawing Sheets

DC TO DC CONVERTER APPARATUS

BACKGROUND OF THE INVENTION

1. Field of the Invention

The present invention relates generally to power supply apparatus and more particularly to an improved DC to DC converter of the type used to provide power for computers and other electronic devices.

2. Description of the Prior Art

DC to DC converters obtain power from an input source and convert it into regulated output power for delivery to a load. However, not all of the input power is converted to output power. Some is dissipated as heat within the converter. The converter's efficiency is defined as the ratio of delivered output power to converter input power. Heat is normally removed from such converters through the use of metal base plates or heat sink devices thermally coupled to but electrically isolated from all internal heat generating components. The basic thermal design problem is to transfer heat from the heat generating components to the base plate and then from the base plate into the surrounding environment.

It is well understood that heat is transferred from regions of high temperature to regions of low temperature via radiation, conduction and convection. While all three mechanisms are active to some degree in every converter, convection will normally be the dominant heat transfer mechanism in most applications.

Although radiant heat transfer occurs continuously between objects at different temperatures which are exposed to each other, the net effect on the temperature of an individual part is dependent on a great many factors including its temperature relative to the other parts, the orientations of the various parts and their surface finishes and spacing. In most cases radiation will account for only a small percentage of the total heat transfer in a converter.

Heat is normally conducted to the base plate of a converter through mechanical connection and surrounding potting materials and then into an attached heat sink or heat conducting member. Heat conducted to the base plate and across the interface between the base plate and a mating member will result in a temperature drop which must normally be controlled. In some cases the heat can be conducted from the base plate of the converter to a remote dissipative surface via a thermally conductive member. The resulting base plate temperature will be the sum of the temperature of the dissipative surface to which the base plate is attached, the temperature rise in the heat conducting member and the rises across the two surface interfaces. Minimizing total temperature rise is dependent on controlling interface resistance and controlling the thermal resistance of the transfer member through appropriate material selection and dimensioning.

Convective heat transfer into air is by far the most commonly used method for cooling modern converters. Free or natural convection refers to a heat transfer from a dissipative surface into a cooler surrounding mass of otherwise still air. Forced convection refers to heat transfer into a moving air stream. Converter temperature depends on the temperature of the air, total dissipated power and the values of two thermal resistances: the thermal resistance of the surface interface between the base plate and the heat sink, and the heat sink to air thermal resistance. Through use of thermally conductive potting materials, heat transfer both to air from the external surfaces of the potted device and to the base plate can be improved Whereas the surface interface resistance can be minimized by the conduction characteristics of the device, the heat sink to air resistance is dependent on a variety of factors including heat sink material and geometry, air temperature, air density and air flow. As designers have attempted to reduce the size and increase the power density of the DC to DC converter, they have attempted to combine the component carrying circuit boards with the base plate to form a metal-backed PC board which can be mounted directly to a heat sink. While this provides a degree of improvement and allows substantial reduction in the size of the device, it suffers the disadvantage that it subjects the control electronics to elevated temperatures.

SUMMARY OF THE INVENTION

It is therefore an objective of the present invention to provide a novel DC to DC converter design in which the advantages of using state-of-the-art metal-backed PC boards is utilized in combination with a companion double-sided or ceramic PC board to provide an extremely compact and highly efficient converter.

Another objective of the present invention is to provide a device of the type described wherein the principal power consuming components are mounted directly on a metal-backed PC board and the controlling electronic components are mounted on a conventional or ceramic PC board.

Still another objective of the present invention is to provide a device of the type described in which surface mount technology is used to connect the various electronic components to the PC boards.

A still further objective of the present invention is to provide a device of the type described which can be assembled using highly automated assembly equipment.

Briefly, a preferred embodiment of the present invention includes a metal-backed PC board which serves as the base plate of the device and has the principal power consuming components affixed thereto, and a conventional or ceramic PC board having the relatively lower power consuming electronic components affixed to it, the latter board being secured in closely spaced relationship to the metal-backed board using connecting elements which provide both electrical and thermal interconnection between the two boards. All device connect pins extend from the conventional or ceramic board, and the entire device is potted in a thermally conductive potting material to improve conduction of heat to the base plate.

An important advantage of the present invention is that through use of the combination of conventional and metal-backed PC boards important advances have been made in the physical size of the device, the power dissipative characteristics of the device, the reliability of the device, and the ease of assembly and thus the cost of the device.

Furthermore, in accordance with the present invention, a converter device is provided having a power density better than 58 watts per cubic inch.

These and other objects and advantages of the present invention will no doubt become apparent to those skilled in the art after having read the following detailed description of the preferred embodiment which is depicted in the several figures of the drawing.

IN THE DRAWING

DETAILED DESCRIPTION OF THE PREFERRED EMBODIMENT

Figure 1:
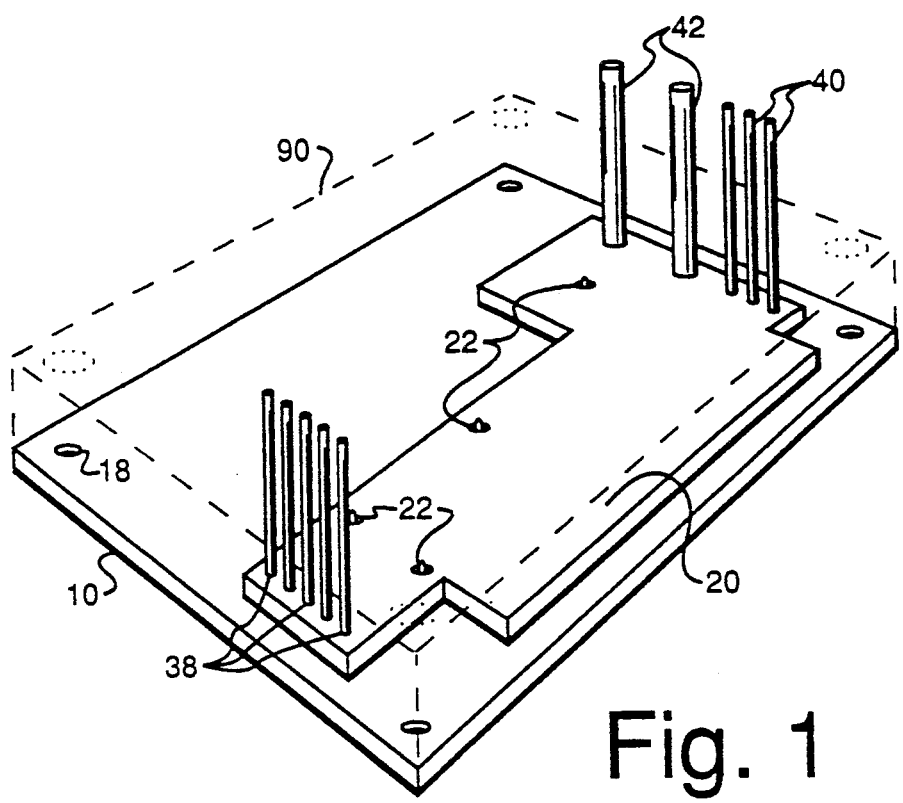
FIG. 1 is an inverted perspective view showing a DC to DC converter apparatus in accordance with the present invention.
Figure 3:
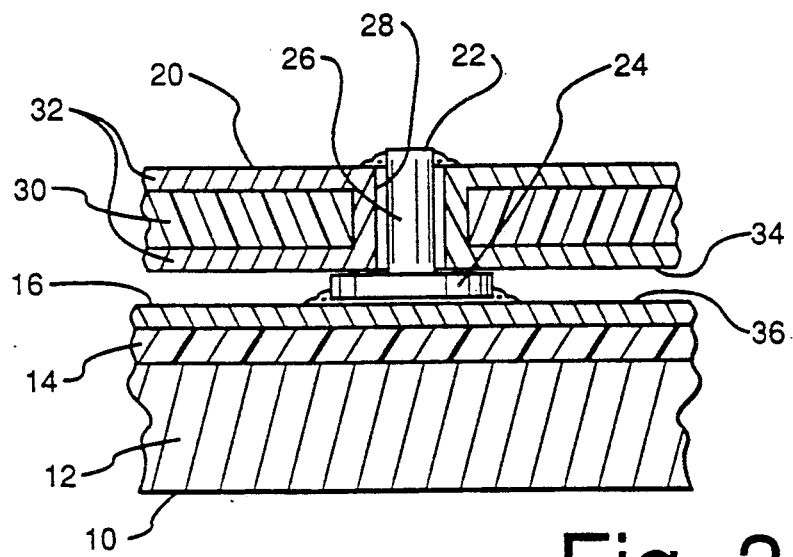
FIG. 3 is a partially broken cross-section taken along the line 3—3 of FIG. 2.

Referring now to FIG. 1 of the drawing, the PC board components of a DC to DC converter in accordance with the present invention is depicted in inverted configuration. As shown, the device includes a metal-backed PC board 10 which is rectangular in configuration and, as depicted in partial cross-section in FIG. 3, is comprised of an aluminum or copper base 12, a dielectric layer 14 and a circuit layer 16. The circuit layer 16 is tin-plated copper covered with a solder mask. The dielectric layer 14 has a thickness of approximately 80 $\mu$m and a dielectric strength greater than 2800 VDC. As illustrated, board 10 is provided with a suitable bolt hole 18 in each corner.

Disposed immediately above plate 10 is a conventional double-sided glass epoxy PC board 20 which is generally L-shaped in configuration and has conductive circuit traces formed top and bottom (not shown in FIG. 1). As further depicted in FIGS. 2 and 3, board 20 is supported above board 10 in spaced apart relationship thereto by a plurality of connecting pins 22 which, as specifically shown in FIG. 3, include a flanged cap portion 24, that is soldered to a circuit trace 16 of board 10, and a shaft portion 26 which extends up through a plated-through aperture 28 in board 20. Note that, as depicted in FIG. 3, board 20 is comprised of a glass epoxy substrate 30 and includes copper circuit traces 32 on both top and bottom. As also shown in FIG. 3, the bottom surface 34 of board 20 is spaced from the upper surface 36 of board 10 by a distance of approximately 0.020 inch determined by the thickness of cap 24. While pins 22 provide both electrical connection between the traces of boards 10 and 20, and a means for conducting heat generated on board 20 to the base plate 12 of board 10, the physical separation between boards 10 and 20 provides a substantial barrier to conduction of heat from the components of board 10 to the components carried by board 20, as will be further explained below. Affixed to opposite ends of board 20 are power-in and signal-in pins 38 and 40, as well as power-out pins 42.

Figure 4:
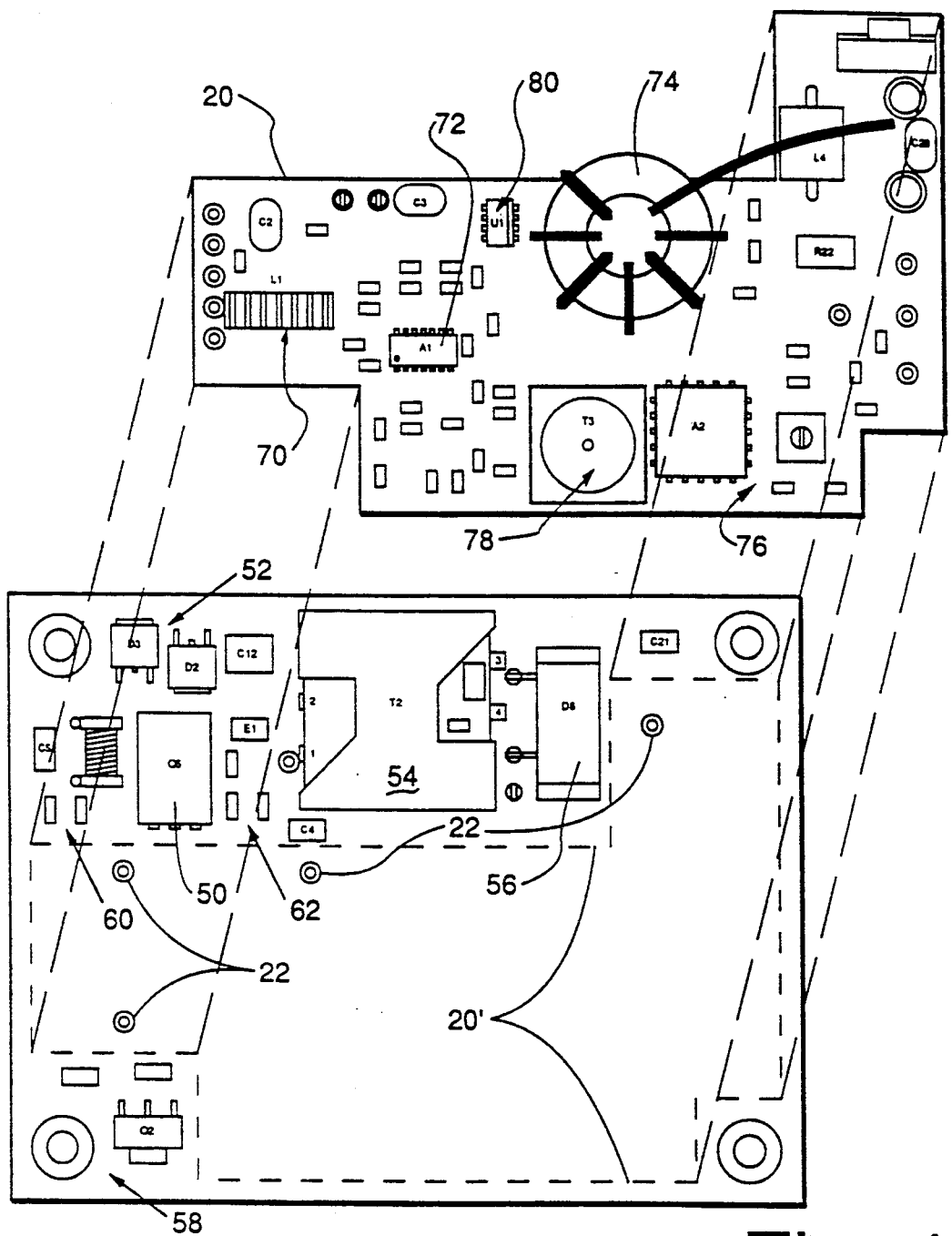
FIG. 4 is an exploded view illustrating the relationship between two principal components of the apparatus shown in FIG. 1.

Turning now to FIG. 4 of the drawing, the positioning and placement of the various electronic components of boards 10 and 20 are depicted. Note that board 20 is shown in exploded disposition relative to board 10 and would normally overlay board 10 in the position denoted by the dashed outline 20'. Observe also that no electrical components are positioned on board 10 within the region to be occupied by board 20. Disposed on the remainder of board 10 is a power transistor 50 (Q5); a load line shaping snubber 52 including the choke L2, resistor R11, diodes D2 and D3, and capacitor C12; a power transformer 54; an output rectifier 56; a device power supply 58 including a zener diode Z2, resistor R3 and NPN transistor Q2; a thermal protection circuit 60 including transistor Q1 and resistor RT1; and a high input voltage protection circuit 62 comprising the zener diode Z2, and resistors R1 and R2. Each of these components, as well as associated resistive and capacitive elements, are mounted to the circuit traces (shown shaded) on board 10 using surface mount technology or other suitable mounting technologies.

Board 20 is populated with an input choke 70 (L1) and associated capacitors C1 and C2; a pulse width modulation IC 72 (A1); an output filter choke 74 (L3) and its associated capacitors; an output sense circuit 76 including capacitors C16, C19 and C23, resistors R18, R19, R20 and R21, a trim pot P1 and a part of the IC feedback generator A2; an isolated feedback circuit 78 comprised of a feedback transformer T3 and a part of IC A2; and a redundant isolated overvoltage sense and feedback circuit 80 including IC opto coupler U1, zener diode Z3 and resistor R17. In addition, various other resistors and capacitors are also included. Most of the above elements are affixed to board 20 using surface mount technology. Alternatively, these elements could be affixed using other mounting technologies.

From the above it will be appreciated that care has been taken to locate the low power consuming components on board 20 while the high power consuming, and thus heat generating components, have been positioned on board 10. Along with the use of surface mount technology this allows not only very dense packing of circuit components but also serves to provide effective thermal isolation between the power elements and the more heat sensitive control circuit elements. Note that all electrical communication between the components of board 20 and those of board 10 is effected through the pins 22, and that such pins also provide means for thermally conducting heat generated on board 20 to the heat sink forming a part of board 10.

Figure 2:
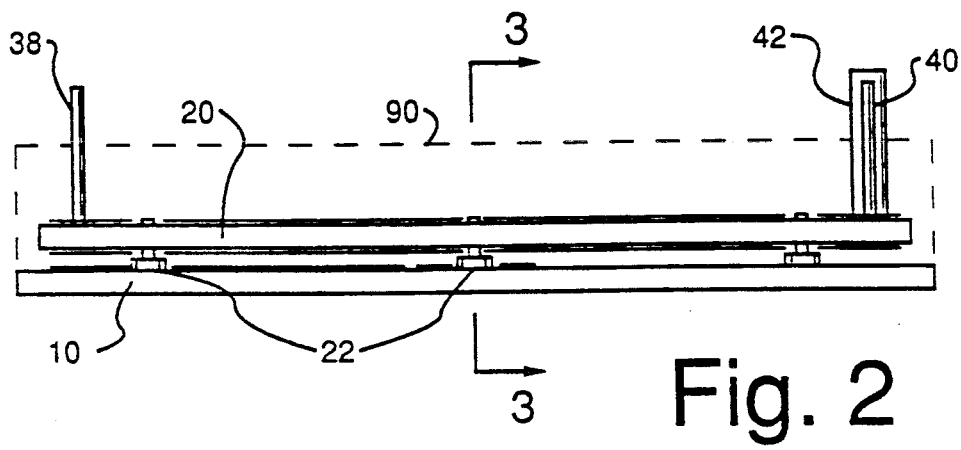
FIG. 2 is an inverted side view of the apparatus shown in FIG. 1.

Once the two boards are assembled and mated together, the entire device is potted using an alumina-filled silicone compound so that, with the exception of the projecting portions of the pins 38, 40 and 42, all parts of the device above board 10 are encapsulated in a rectangular block as depicted by the dashed lines 90 in FIGS. 1 and 2 of the drawing. As shown in these figures, the lower face of board 10 will provide a flat heat sinking surface which can be readily affixed to other heat dissipating means while the pins 38, 40 and 42 all extend through the opposite face of the device to accommodate operative attachment to the mother board or other boards of apparatus to be powered by the subject device.

Figure 5:
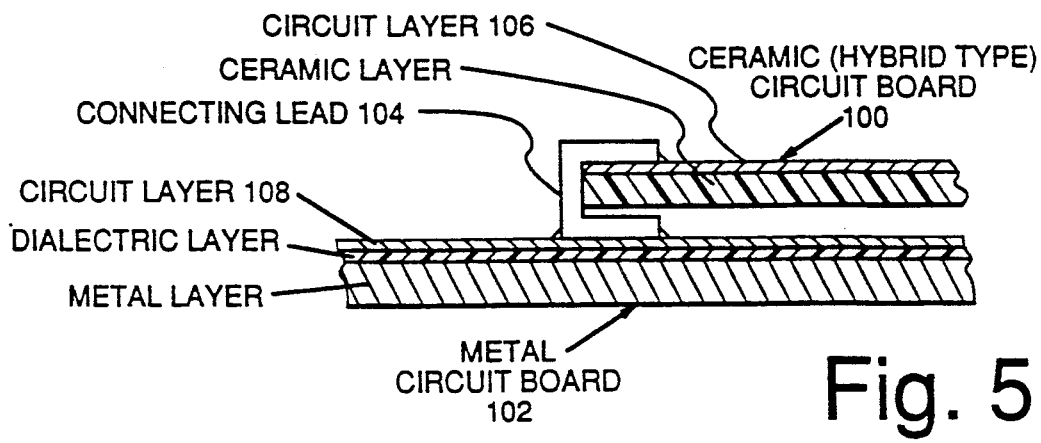
FIG. 5 is a partially broken cross-section illustrating details of a first alternative embodiment.

In FIG. 5 an alternative circuit board combination and coupling mechanism is depicted. In this embodiment a ceramic (hybrid type) circuit board 100 is used in place of the conventional PC board and is supported above metal board 102 by generally C-shaped metallic connectors 104 soldered to the circuit layers 106 and 108 of the respective boards.

Figure 6:
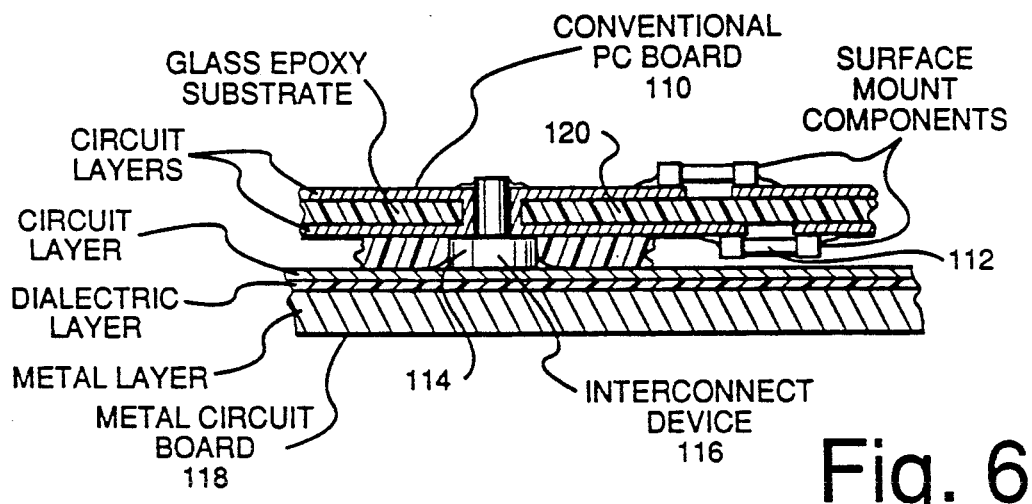
FIG. 6 is a partially broken cross-section illustrating details of a second alternative embodiment.

In FIG. 6 a second alternative board configuration is shown including a conventional glass epoxy PC board 110 having circuit components mounted on both sides of the board, preferably using surface mount technology. Note that in order to provide clearance for the lower side components 112, the flange or "cap" portion 114 of the interconnect device 116 is sized to provide appropriate spacing (typically about 0.07 inch) between the boards 110 and 118. In this embodiment it is also desirable that the space between the two boards be filled with a non-thermally conductive adhesive silicone 120 in order to improve the attachment of one board to the other and to prevent the thermally conductive potting compound from filling the space. In some cases it may be appropriate to merely seal the perimeter of the smaller board to the larger board with adhesive silicone to accomplish a similar purpose.

Although the present invention has been disclosed in terms of presently preferred embodiments, it will be appreciated by those skilled in the art that numerous alterations and modifications thereof can be made to facilitate particular applications. It is therefore intended that the appended claims be interpreted as covering all such alterations and modifications as fall within the true spirit and scope of the invention.

What is claimed is:

1. An improved DC to DC converter apparatus comprising:
   a generally rectangular, metal-backed first PC board including a metal layer, an insulating layer and a first circuit layer, the insulating layer being sandwiched between said metal layer and said first circuit layer, said first board having a first surface region and a second surface region, said second region having a plurality of electrical circuit components disposed thereon and electrically connected to conductive traces forming said first circuit layer;
   a second PC board comprised of a dielectric substrate having a second circuit layer on one side, said second board having mounted thereto a plurality of electrical circuit components and input and output pins electrically interconnected by the conductive traces of said second circuit layers;
   electrically conductive means affixing said second board to said first board in proximate, spaced apart relationship to said first region, said electrically conductive means serving to electrically interconnect the circuit traces of said first and second boards and to thermally interconnect said second board with said first board; and
   potting means encapsulating said first and second boards and their associated electrical components with only said input-output pins extending therefrom, one side of said first board forming a heat conducting external surface of the encapsulated device.

2. An improved DC to DC converter apparatus as recited in claim 1 wherein the principal power consuming components of said converter apparatus are mounted directly to said first board and wherein the relatively lower power consuming circuit elements are mounted on said second board.

3. An improved DC to DC converter apparatus as recited in claim 2 wherein all electrical components affixed to said first and second boards are connected thereto using surface mount technology.

4. An improved DC to DC converter apparatus as recited in claim 3 wherein said potting means is an alumina-filled silicone compound.

5. An improved DC to DC converter apparatus as recited in claim 4 wherein said second board is a double-sided glass epoxy PC board.

6. An improved DC to DC converter apparatus as recited in claim 5 wherein said second board is generally L-shaped in configuration and lies entirely within said potting means.

7. An improved DC to DC converter apparatus as recited in claim 6 wherein said electrically conductive means are pins including an integrally formed flange the thickness of which forms a spacer for separating said second board from said first board.

8. An improved DC to DC converter apparatus as recited in claim 5 wherein said second board has a third circuit layer on its other side and circuit components are attached to both sides of the board.

9. An improved DC to DC converter apparatus as recited in claim 8 wherein at least space between the perimeter of said second board and said first board is filled with a non-thermally conductive silicone adhesive.

10. An improved DC to DC converter apparatus as recited in claim 4 wherein said second board is a hybrid ceramic PC board.

11. An improved DC to DC converter apparatus as recited in claim 1 wherein all electrical components affixed to said first and second boards are connected thereto using surface mount technology.

12. An improved DC to DC converter apparatus as recited in claim 1 wherein said potting means is an alumina-filled silicone compound.

13. An improved DC to DC converter apparatus as recited in claim 1 wherein said second board is a double-sided glass epoxy PC board.

14. An improved DC to DC converter apparatus as recited in claim wherein said second board is generally L-shaped in configuration and lies entirely within said potting means.

15. An improved DC to DC converter apparatus as recited in claim 1 wherein said electrically conductive means are pins including an integrally formed flange the thickness of which forms a spacer for separating said second board from said first board.

16. An improved DC to DC converter apparatus as recited in claim 1 wherein said electrically conductive means are generally C-shaped metallic connectors, the lower portion of which is bonded to said first circuit layer, and the upper portion of which is bonded to said second circuit layer.

17. An improved DC to DC converter apparatus as recited in claim 16 wherein all electrical components affixed to said first and second boards are connected thereto using surface mount technology.

18. An improved DC to DC converter apparatus as recited in claim 13 wherein said potting means is an alumina-filled silicone compound.

19. An improved DC to DC converter apparatus as recited in claim 12 wherein at least some of the space between said second board and said first board is filled with a non-thermally conductive silicone adhesive.

20. An improved DC to DC converter apparatus as recited in claim 11 wherein said second board has a third circuit layer on its other side and circuit components are attached to both sides of the board.

* * * * *